(12) United States Patent
Luo et al.

(10) Patent No.: US 8,828,840 B2
(45) Date of Patent: Sep. 9, 2014

(54) SEMICONDUCTOR DEVICE AND METHOD FOR MANUFACTURING THE SAME

(75) Inventors: Zhijiong Luo, Poughkeepsie, NY (US);
Huilong Zhu, Poughkeepsie, NY (US);
Haizhou Yin, Poughkeepsie, NY (US)

(73) Assignee: Chinese Academy of Sciences, Institute of Microelectronics, Beijing (CN)

( * ) Notice: Subject to any disclaimer, the term of this patent is extended or adjusted under 35 U.S.C. 154(b) by 108 days.

(21) Appl. No.: 13/379,546

(22) PCT Filed: Apr. 26, 2011

(86) PCT No.: PCT/CN2011/073296
§ 371 (c)(1),
(2), (4) Date: Dec. 20, 2011

(87) PCT Pub. No.: WO2012/094857
PCT Pub. Date: Jul. 19, 2012

(65) Prior Publication Data
US 2012/0175675 A1    Jul. 12, 2012

(30) Foreign Application Priority Data
Jan. 12, 2011 (CN) .......... 2011 1 0005924

(51) Int. Cl.
*H01L 21/762* (2006.01)
*H01L 21/02* (2006.01)

(52) U.S. Cl.
CPC .... *H01L 21/76232* (2013.01); *H01L 21/02639* (2013.01); *H01L 21/02647* (2013.01); *H01L 21/02381* (2013.01); *H01L 21/02521* (2013.01)
USPC ........... 438/424; 438/219; 438/221; 438/294; 257/183; 257/E29.02; 257/E21.546

(58) Field of Classification Search
CPC .............. H01L 21/00; H01L 21/02546; H01L 21/0262; H01L 21/02532; H01L 21/0245; H01L 29/7371; H01L 29/267; H01L 29/66318; H01L 29/66242
USPC ............ 438/424, 219, 221, 294; 257/E29.02, 257/E21.546, 183
See application file for complete search history.

(56) References Cited

U.S. PATENT DOCUMENTS 5,103,276 A * 4/1992 Shen et al. .................... 257/302
7,579,664 B2   8/2009 Seo
(Continued)

FOREIGN PATENT DOCUMENTS

CN    1437242 A    8/2003
CN    101079445 A  11/2007

OTHER PUBLICATIONS

International Search Report from PCT/CN2011/073296 dated Oct. 13, 2011 (5 pages).
(Continued)

*Primary Examiner* — Thinh T Nguyen
(74) *Attorney, Agent, or Firm* — Osha Liang LLP

(57) ABSTRACT

A semiconductor device and a method for manufacturing the same are disclosed. The method comprises: forming at least one trench in a first semiconductor layer, wherein at least lower portions of respective sidewalls of the trench tilt toward outside of the trench; filling a dielectric material in the trench, thinning the first semiconductor layer so that the first semiconductor layer is recessed with respect to the dielectric material, and epitaxially growing a second semiconductor layer on the first semiconductor layer, wherein the first semiconductor layer and the semiconductor layer comprise different materials from each other. According to embodiments of the disclosure, defects occurring during the heteroepitaxial growth can be effectively suppressed.

6 Claims, 4 Drawing Sheets

(56) References Cited

U.S. PATENT DOCUMENTS

| | | | |
|---|---|---|---|
| 7,642,151 B2* | 1/2010 | Muramatsu | 438/219 |
| 7,928,474 B2* | 4/2011 | Lin et al. | 257/190 |
| 2005/0136584 A1* | 6/2005 | Boyanov et al. | 438/199 |
| 2005/0285187 A1* | 12/2005 | Bryant et al. | 257/335 |
| 2009/0047767 A1* | 2/2009 | Muramatsu | 438/294 |
| 2009/0061586 A1* | 3/2009 | Yu et al. | 438/296 |

OTHER PUBLICATIONS

Written Opinion from PCT/CN2011/073296 dated Oct. 13, 2011 (4 pages).
Espacenet Abstract CN1437242A dated Aug. 20, 2003 (1 page).
Espacenet Abstract CN101079445A dated Nov. 28, 2007 (1 page).

* cited by examiner

SEMICONDUCTOR DEVICE AND METHOD FOR MANUFACTURING THE SAME

CROSS-REFERENCE TO RELATED APPLICATION(S)

This application is a national phase application of, and claims priority to PCT Application No. PCT/CN2011/073296, entitled "SEMICONDUCTOR DEVICE AND METHOD FOR MANUFACTURING THE SAME," which claimed priority to Chinese Application No. 201110005924.7 filed on Jan. 12, 2011. Both the PCT Application and the Chinese Application are incorporated herein by reference in their entireties.

TECHNICAL FIELD

The present disclosure relates to the field of semiconductor, and particularly, to a semiconductor device comprising a heteroepitaxy structure and a method for manufacturing the same.

BACKGROUND

Generally, heteroepitaxy means epitaxially growing on a crystal material another crystal material, e.g. epitaxially growing germanium (Ge) or Group III/V compound semiconductor, etc. on a silicon (Si) substrate. With the continuous development of the semiconductor technology, the heteroepitaxy technology is becoming more and more important. For example, a high-performance Ge-channel Metal Oxide Semiconductor Field Effect Transistor (MOSFET) can be formed by depositing Ge having high carrier mobility as a channel material on a Si substrate. Further, it is possible to facilitate the integration of photoelectric devices with the Si Complementary Metal Oxide Semiconductor (CMOS) technology by depositing a Group III/V compound semiconductor material and the like, for example, on a Si substrate.

However, the lattices of the two crystal materials generally do not match, causing defects such as dislocations during the growth. For example, epitaxially growing more than a few nanometers (nm) of Ge directly on Si can lead to a dislocation density of $10^8$-$10^9$/cm$^2$ due to the lattice mismatch of 4.2% between the two materials. Such defects have negative impacts on the grown crystal and thus a resulting device.

Currently, various methods have been proposed to reduce such defects occurring in heteroepitaxy, e.g. the graded buffer technology, the post-growth high-temperature annealing technology, and the Aspect Ratio Trapping (ART) technology, etc. FIG. 1 is a schematic diagram showing how to reduce the defects by ART. As shown in FIG. 1, a dielectric material (e.g. SiO$_2$) 110 is disposed on a Si substrate 100. The dielectric material 110 has openings with a large Aspect Ratio (AR) defined therein. Then a Ge layer 120, for example, is epitaxially grown on the Si substrate 100. It has been found that defects occurring during the growth such as dislocations are approximately perpendicular to the growing surface. Since the size of the openings defined in the dielectric material 110 is relatively small, the grown Ge material generally has a profile where a middle portion is relative high and side portions are relative low in the respective openings. Namely, the growing surface is not parallel to the substrate surface, so the defects 130 extend upward in oblique directions as shown in FIG. 1. Finally, these defects terminate at the non-crystal dielectric material 110 and are prevented from further extending upward.

It can be seen from FIG. 1 that the dielectric material 100 needs to be sufficiently high to effectively terminate the defects. The present disclosure provides a solution to terminate the defects more effectively.

SUMMARY

The present disclosure provides, among other things, a semiconductor device and a method for manufacturing the same, to reduce defects occurring in heteroepitaxy more effectively.

According to an embodiment, there is provided a method for manufacturing a semiconductor device, comprising: forming at least one trench in a first semiconductor layer, wherein at least lower portions of respective sidewalls of the trench tilt toward outside of the trench; filling a dielectric material in the trench; thinning the first semiconductor layer so that the first semiconductor layer is recessed with respect to the dielectric material, and epitaxially growing a second semiconductor layer on the first semiconductor layer, wherein the first semiconductor layer and the semiconductor layer comprise different materials from each other.

The arrangement, in which (at least) a portion of respective one of sidewalls of the dielectric material tilts toward outside, can suppress defects caused by epitaxial growth more effectively during the heteroepitaxial growing of the second semiconductor layer, so as to improve performances of the resultant device.

Optionally, the dielectric material may also be a basis for forming shallow trench isolation, Thus the process according to the present disclosure may be compatible with conventional CMOS processes.

Optionally, forming the at least one trench in the first semiconductor layer may comprise: forming at least one opening in the first semiconductor layer by anisotropic etching; and forming the trench by isotropically etching the openings. For example, the anisotropic etching may comprise dry etching such as Reactive Ion Etching (RIE), and the isotropic etching may comprise wet etching such as etching with KOH or TMAH.

Optionally, the respective sidewalls of the trench may tilt toward outside of the trench, wherein an angle between respective one of the sidewalls and the first semiconductor layer is less than or equal to 80°.

Optionally, the first semiconductor layer may have a surface defined by a (100) crystal face. In this way, after the isotopic etching, the trench may be formed to have a hexagon-like longitudinal section.

Optionally, the first semiconductor layer may comprise Si, and the second semiconductor layer may comprise Ge or Group III/V compound semiconductors.

According to a further embodiment, there is provided a semiconductor device, comprising: a first semiconductor layer; a dielectric material layer disposed on the first semiconductor layer, wherein the dielectric material layer protrudes with respect to a surface of the first semiconductor layer, and has sidewalls such that at least lower portions of respective sidewalls tilt toward outside of the dielectric material layer; and a second semiconductor layer on the first semiconductor layer, wherein the first semiconductor layer and the second semiconductor layer comprise different materials from each other.

Optionally, the dielectric material layer may form shallow trench isolation,

Optionally, respective sidewalls of the dielectric material layer tilt toward outside of the dielectric material layer, wherein an angle between respective one of the sidewalls and the first semiconductor layer is less than or equal to 80°. Optionally, the first semiconductor layer may comprise Si, and the second semiconductor layer may comprise Ge or Group III/V compound semiconductors.

Likewise, the semiconductor device according to the present disclosure can also achieve features and advantages as described with respect to the method according to the present disclosure.

BRIEF DESCRIPTION OF THE DRAWINGS

The above and other objects, features, and advantages of the present invention will become apparent from the following descriptions on embodiments of the present invention with reference to the drawings, in which.

DETAILED DESCRIPTION

Figure 1:
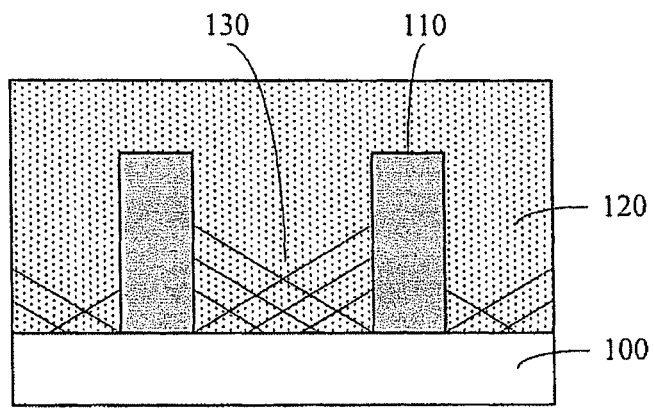
FIG. 1 is a diagram showing a heteroepitaxy growing method according to the prior art.

Next, the present invention will be described with reference to specific embodiments shown in the drawings. However, it should be understood that these descriptions are only illustrative and are not intended to limit the scope of the present invention. Further, in the following, explanations on well-known structures and technologies are omitted, in order not to unnecessarily obscure the concept of the present invention.

In the drawings, various layer structures according to embodiments of the present invention are schematically shown. However, they are not drawn to scale, and some features may be enlarged while some features may be omitted for purpose of clarity. Shapes, sizes and relative positions of respective regions and layers are only illustrative, and deviations therefrom may occur due to manufacture tolerances and technical limits. Those skilled in the art can otherwise design regions/layers of different shapes, sizes, or relative positions according to actual requirements.

Figure 2:
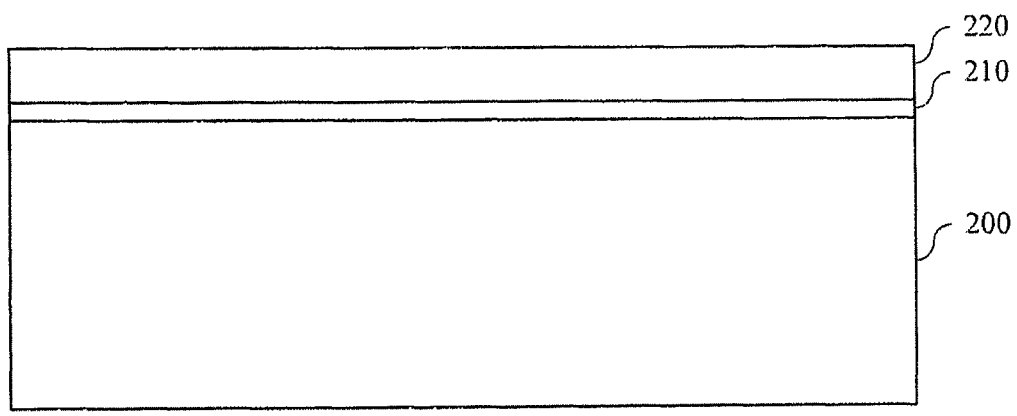
FIGS. 2-8 are schematic sectional views showing structures obtained in respective stages of a flow for manufacturing a semiconductor structure according to an embodiment of the present disclosure.

As shown in FIG. 2, a semiconductor substrate 200 is provided, which may be referred to as a first semiconductor layer. The semiconductor substrate 200 may comprise a first semiconductor material such as Si and Ge. Next, the present disclosure will be described by taking the Si substrate as an example. However, it does not mean that the present disclosure is limited thereto. In other embodiments, the first semiconductor material (first semiconductor layer) may comprise Silicon-On-Insulator (SOI) or silicon-germanium-on-insulator, or any semiconductor material formed on the semiconductor substrate 200 such as SiC. Also, the first semiconductor material (first semiconductor layer) may comprise any semiconductor material formed on another substrate (e.g. glass), or even group III/V compound semiconductors (e.g. GaAs, InP, etc.), or group II/VI compound semiconductors (e.g. ZnSe, ZnS), etc.

An oxide layer 210 (e.g. silicon oxide) and a nitride layer 220 (silicon nitride) are formed on the semiconductor substrate 200. The oxide layer 210 and the nitride layer 220 are used as a hard mask in subsequent processes.

Figure 3:
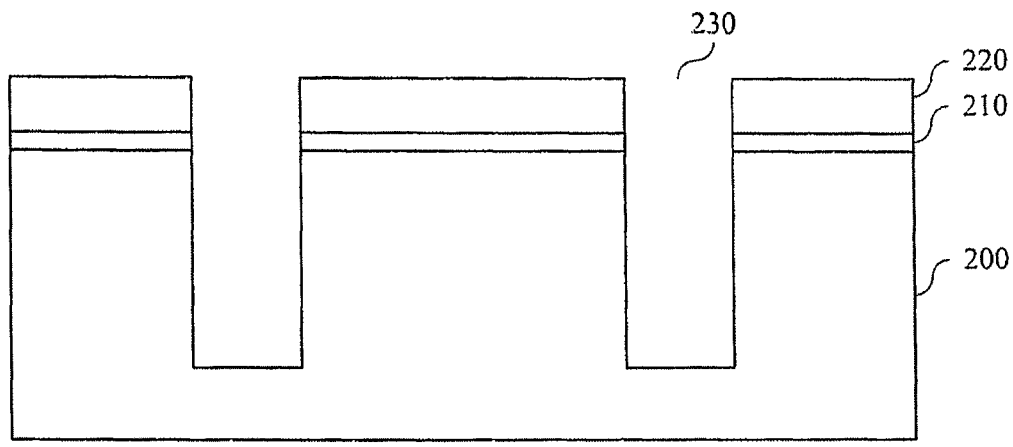

Subsequently, as shown in FIG. 3, at least one opening is formed in the hard mask, which comprises the oxide layer 210 and the nitride layer 220. Then at least one opening 230 is formed in the semiconductor substrate 200 by anisotropically etching the semiconductor substrate 200 with the hard mask as an etching mask. For example, the opening 230 may be formed by dry etching such as RIE. Optionally, the opening 230 may correspond to a trench for Shallow Trench Isolation (STI) to achieve compatibility with conventional CMOS processes.

Figure 4:
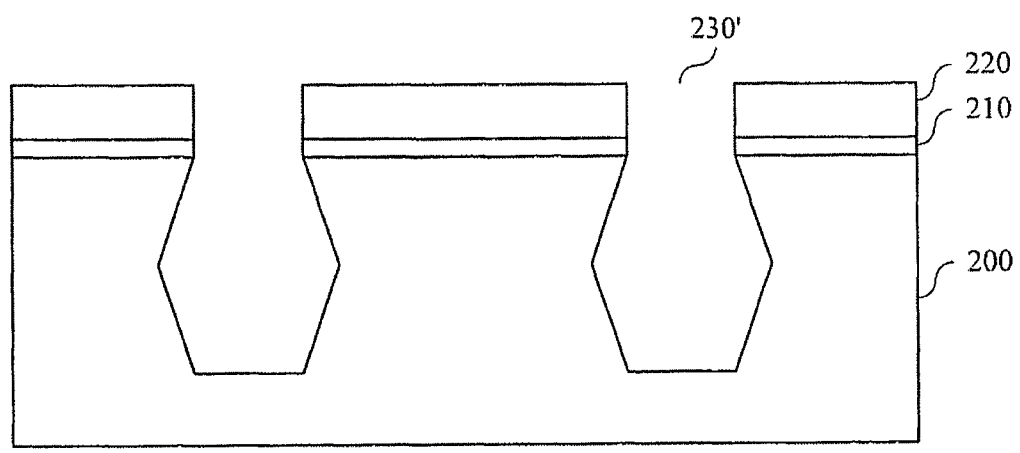

Next, as shown in FIG. 4, the opening 230 is further etched isotropically with KOH or TMAH, in such a way that lower portions of respective sidewalls of the opening 230 tilt toward outside of the opening 230. Such tilt is due to a difference in etching rates of an etchant in different crystal orientations, for example. For example, in a case where the substrate has a surface defined by a (100) crystal face, a trench with a hexagon-like longitudinal section as shown in FIG. 4 may be formed by wet etching using the etchant such as KOH or TMAH.

Figure 5:
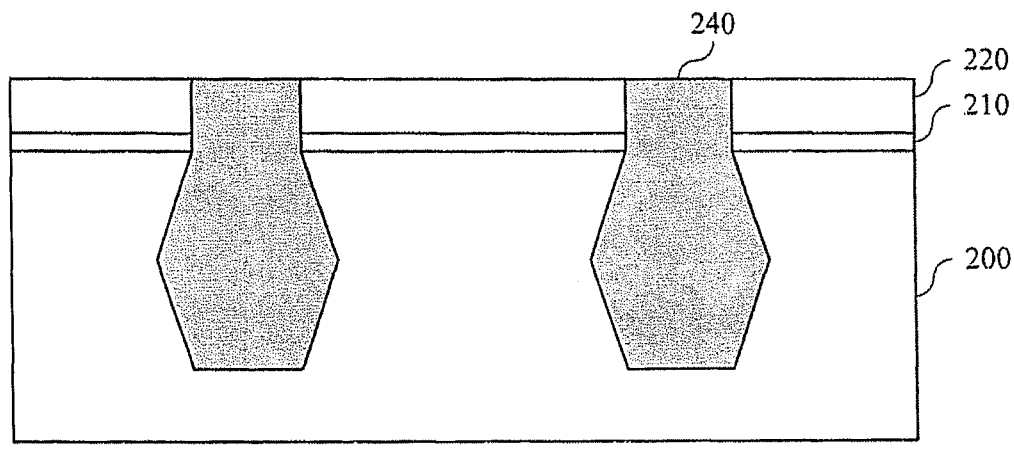

Then, as shown in FIG. 5, a dielectric material 240 is filled in the opening 230. For example, if the opening 230 is also used as a trench for STI, the filled dielectric material, such as silicon oxide, may be a basis for eventually forming the STI. Portions of the dielectric material remaining after subsequent processes, specifically, those remaining after a second semiconductor layer is formed and further planarized to expose the dielectric material, may be used as the STI.

It should be noted that the process of forming the opening (trench) in the semiconductor substrate and filling the opening (trench) with the dielectric material is well known per se in the art. Those skilled in the art can devise many ways to achieve this process. According to the present disclosure, the formed opening (trench) are shaped so that lower portions of respective sidewalls of the opening (trench) tilt toward outside of the opening (trench), rather than being perpendicular to the surface of the semiconductor substrate.

Figure 6:
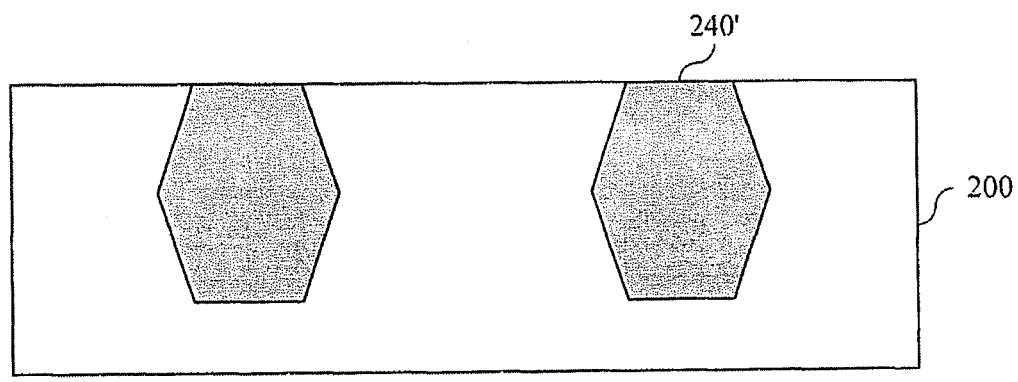

Then, as shown in FIG. 6, the hard mask, which comprises the oxide layer 210 and the nitride layer 220, is removed by planarization such as Chemical Mechanical Polishing (CMP). Meanwhile, a portion of the dielectric material 240, which is located within the hard mask layer, is also removed. As a result, a dielectric material 240', which is used to terminate defects occurring during epitaxial growth, is finally obtained. The dielectric material 240' may also be used as the STI.

Figure 7:
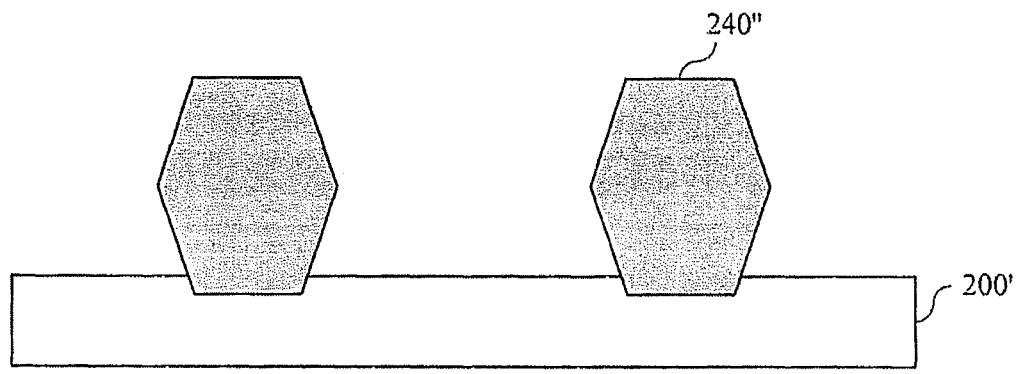

Next, as shown in FIG. 7, the semiconductor substrate 200 is further thinned by etching such as Reactive Ion Etching (RIE), in such a way that a resulting semiconductor substrate 200' is recessed with respect to the dielectric material 240". Here the dielectric material 240" is also recessed with respect to the dielectric material 240', because the dielectric material 240' also has a portion thereof removed during the process of thinning the semiconductor substrate 200, resulting in the dielectric material 240", even if an etchant that has a higher etching selectivity of the dielectric material 240' vs. the semiconductor substrate 200 is selected.

Figure 8:
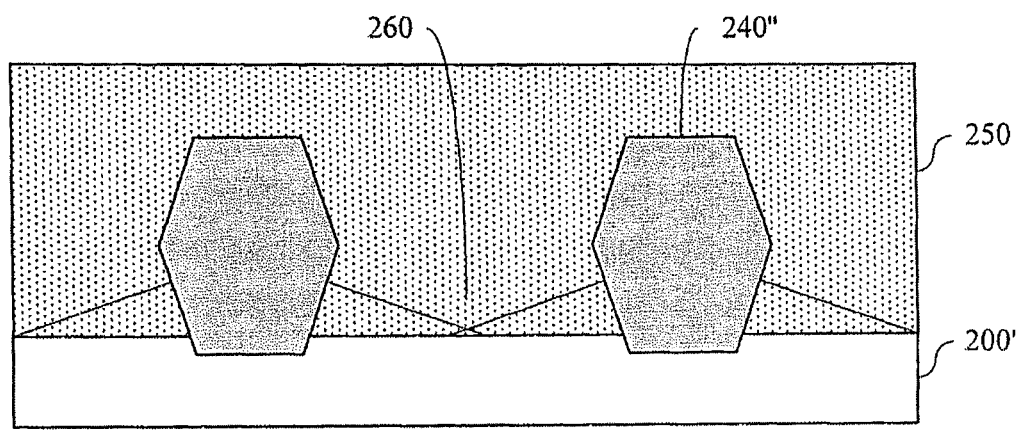

Finally, as shown in FIG. 8, a second semiconductor material 250 such as Ge, which is different from the first semiconductor material, is epitaxially grown on the semiconductor substrate 200', to form the second semiconductor layer. The second semiconductor material is not limited to Ge, but may comprise any one of: IV group compound semiconductor such as SiGe and SiC, Group III/V compound semiconductors such as GaAs and InP, group II/VI compound semiconductors such as ZnSe and ZnS, and the like. In general, there are lattice mismatches between the second semiconductor material and the first semiconductor material.

The second semiconductor material may be epitaxially grown in various ways, such as Metal Organic Chemical Vapor Deposition (MOCVD), Low Pressure Chemical Vapor Deposition (LPCVD), Molecular Beam Epitaxy (MBE), and Atom Layer Deposition (ALD). The epitaxial growth process is well known per se, and detailed descriptions thereof are omitted.

As in the ART technology, heteroepitaxy within spaces defined by the dielectric material 240" will cause defects 260 occurring during the epitaxy, such as dislocations, to extend upward obliquely and finally terminate at sidewalls of the dielectric material 240". Because lower portions of the respective sidewalls of the dielectric material 240" tilt in a way as described above, the defects can terminate in a more effective way.

Figure 9:
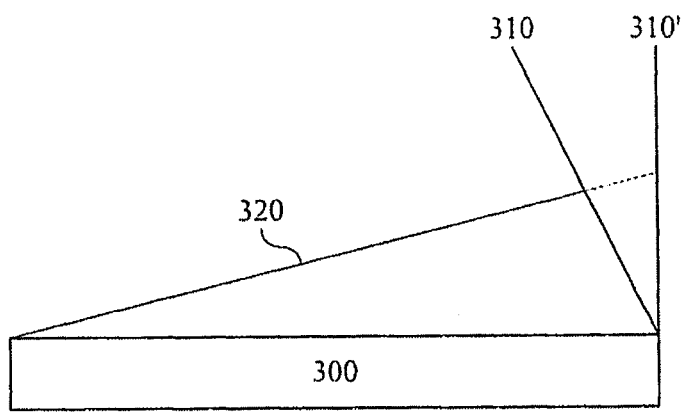
FIG. 9 is a diagram showing a schematic concept of the present disclosure.

FIG. 9 shows a schematic diagram illustrating termination of the defects in a case of perpendicular sidewalls and a case of tilting sidewalls, respectively. As shown in FIG. 9, on a semiconductor substrate 300, a position at which a defect 320 terminates when a sidewall 310' of a dielectric material is perpendicular to the substrate surface is higher than a position at which the defect 320 terminates when a sidewall 310 of the dielectric material tilts with respect to the substrate surface, Therefore, the defects can be terminated in a more effective way according to embodiments of the present disclosure, so that the defects in the epitaxially grown layer can be further reduced.

In the foregoing embodiments, the dielectric material is formed by forming the trench in the semiconductor substrate and then filling the trench, but the dielectric material may also be formed in other ways. Also, although the sidewalls of the dielectric material are shown in the figures in a shape with its middle portion protruding with respect to its upper and lower portions, other shapes are also possible. For example, the sidewalls of the dielectric material may tilt toward outside. In such a case, an angle between respective one of the sidewalls and the surface of the substrate (the first semiconductor layer) is less than or equal to 80°, for example.

The present disclosure further provides a semiconductor device, comprising: a first semiconductor layer; a dielectric material layer disposed on the first semiconductor layer, wherein the dielectric material layer protrudes with respect to a surface of the first semiconductor layer, and has sidewalls such that at least lower portions of respective sidewalls tilt toward outside of the dielectric material layer; and a second semiconductor layer on the first semiconductor layer, wherein the first semiconductor layer and the second semiconductor layer comprise different materials from each other.

Optionally, the dielectric material layer may form shallow trench isolation.

Optionally, when the sidewalls of the dielectric material layer tilt toward outside of the dielectric material layer, an angle between respective one of the sidewalls and the first semiconductor layer can be less than or equal to 80°.

Optionally, the first semiconductor layer may comprise Si, and the second semiconductor layer may comprise Ge or Group III/V compound semiconductors.

The structural compositions, materials, and forming methods of the respective parts in the respective embodiments of the semiconductor structure may be the same as those described in the above-described method embodiments for forming the semiconductor structure, and thus detailed descriptions thereof are omitted.

In the above description, details of patterning and etching of the respective layers are not provided. It is to be understood by those skilled in the art that various means in the prior art may be utilized to form the layers and regions in desired shapes. Further, to achieve the same feature, those skilled can devise different methods than those described above. Although the respective embodiments are described respectively above, it does not necessarily mean that advantageous features of those embodiments cannot be used in combination.

The present invention is described above with reference to the embodiments thereof. However, those embodiments are provided just for illustrative purpose, rather than limiting the present invention. The scope of the invention is defined by the attached claims as well as equivalents thereof. Those skilled in the art can make various alternations and modifications without departing from the scope of the invention, which all fall into the scope of the invention.

We claim:

1. A method for manufacturing a semiconductor device, comprising:
   forming at least one trench in a first semiconductor layer, wherein at least lower portions of respective sidewalls of the trench tilt toward outside of the trench;
   filling a dielectric material in the trench;
   thinning the first semiconductor layer so that the first semiconductor layer is recessed with respect to the dielectric material; and
   epitaxially growing a second semiconductor layer on the first semiconductor layer, wherein the first semiconductor layer and the second semiconductor layer comprise different materials from each other,
   wherein defects occurring during the growing of the second semiconductor layer are substantially terminated by sidewalls of the dielectric material.

2. The method according to claim 1, wherein shallow trench isolation is formed from the dielectric material.

3. The method according to claim 1, wherein forming at least one trench in the first semiconductor layer comprises:
   forming at least one opening in the first semiconductor layer by anisotropic etching; and
   forming the trench by isotropically etching the opening.

4. The method according to claim 1, wherein in forming the trench in the first semiconductor layer;respective sidewalls of the trench tilt toward outside of the trench, and wherein an angle between respective one of the sidewalls and the first semiconductor layer is less than or equal to 80°.

5. The method according to claim 1, wherein the first semiconductor layer has a surface defined by a (100) crystal face.

6. The method according to claim 1, wherein the first semiconductor layer comprises Si, and the second semiconductor layer comprises Ge or group III/V compound semiconductors.

* * * * *

UNITED STATES PATENT AND TRADEMARK OFFICE
CERTIFICATE OF CORRECTION

PATENT NO. : 8,828,840 B2  
APPLICATION NO. : 13/379546  
DATED : September 9, 2014  
INVENTOR(S) : Zhijiong Luo et al.

Page 1 of 1

It is certified that error appears in the above-identified patent and that said Letters Patent is hereby corrected as shown below:

On the title page, (73), Assignee "Chinese Academy of Sciences, Institute of Microelectronics, Beijing (CN)" should read -- Institute of Microelectronics, Chinese Academy of Sciences, Beijing (CN) --.

Signed and Sealed this  
Eighteenth Day of November, 2014

Michelle K. Lee  
*Deputy Director of the United States Patent and Trademark Office*